United States Patent
Iwai

(10) Patent No.: US 9,030,880 B2
(45) Date of Patent: May 12, 2015

(54) NONVOLATILE SEMICONDUCTOR STORAGE DEVICE

(71) Applicant: Kabushiki Kaisha Toshiba, Tokyo (JP)

(72) Inventor: Makoto Iwai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 238 days.

(21) Appl. No.: 13/847,085

(22) Filed: Mar. 19, 2013

(65) Prior Publication Data

US 2013/0314996 A1 Nov. 28, 2013

(30) Foreign Application Priority Data

May 24, 2012 (JP) .................................. 2012-118467

(51) Int. Cl.
| | | |
|---|---|---|
| *G11C 16/24* | (2006.01) | |
| *G11C 16/26* | (2006.01) | |
| *G11C 16/14* | (2006.01) | |
| *G11C 16/04* | (2006.01) | |
| *G11C 16/34* | (2006.01) | |

(52) U.S. Cl.
CPC ................ *G11C 16/24* (2013.01); *G11C 16/26* (2013.01); *G11C 16/14* (2013.01); *G11C 16/0483* (2013.01); *G11C 16/3418* (2013.01)

(58) Field of Classification Search
USPC ............................. 365/185.17, 185.25, 185.21
See application file for complete search history.

(56) References Cited

U.S. PATENT DOCUMENTS

| | | | |
|---|---|---|---|
| 5,912,489 A | 6/1999 | Chen et al. | |
| 6,480,419 B2 * | 11/2002 | Lee ........................ | 365/185.18 |
| 6,643,180 B2 | 11/2003 | Ikehashi et al. | |
| 6,819,596 B2 | 11/2004 | Ikehashi et al. | |
| 7,245,533 B2 * | 7/2007 | Shibata ................... | 365/185.17 |
| 8,000,151 B2 | 8/2011 | Yamada et al. | |
| 2011/0235416 A1 | 9/2011 | Otsuka et al. | |

FOREIGN PATENT DOCUMENTS

| | | |
|---|---|---|
| JP | 8-46159 | 2/1996 |
| JP | 2001-518696 A | 10/2001 |
| JP | 2002-117699 | 4/2002 |
| JP | 2006-80157 A | 3/2006 |
| JP | 2009-170077 A | 7/2009 |
| JP | 2011-198437 | 10/2011 |
| WO | WO 99/17294 A1 | 4/1999 |

* cited by examiner

*Primary Examiner* — Alexander Sofocleous
*Assistant Examiner* — Alfredo Bermudez Lozada
(74) *Attorney, Agent, or Firm* — Oblon, McClelland, Maier & Neustadt, L.L.P.

(57) ABSTRACT

According to one embodiment, a nonvolatile semiconductor storage device includes a memory cell array where memory cells are arranged in a cell well in a row direction and a column direction in a matrix; word lines which select the memory cell in the row direction; bit lines which select the memory cell in the column direction; a sense amplifier which determines a value stored in the memory cell based on a potential of the bit line; a peripheral transistor in the memory cell array which is arranged in the periphery of the memory cell array; and an enhancement type transistor which drives a gate of the peripheral transistor.

20 Claims, 13 Drawing Sheets

AFTER WRITING FOR FIRST PAGE BEFORE WRITING FOR SECOND PAGE

WRITING FOR SECOND PAGE

AFTER ERASING

NONVOLATILE SEMICONDUCTOR STORAGE DEVICE

CROSS-REFERENCE TO RELATED APPLICATIONS

This application is based upon and claims the benefit of priority from Japanese Patent Application No. 2012-118467, filed on May 24, 2012; the entire contents of which are incorporated herein by reference.

FIELD

Embodiments described herein relate generally to a nonvolatile semiconductor storage device.

BACKGROUND

In a NAND type flash memory, in order to reduce a chip area, a charge/discharge transistor which charges or discharge bit lines or a select transistor which selects a bit line may be formed in a well where a memory cell is formed. In this case, during an erase operation for the memory cell, a high voltage may be applied to gate insulating films of the charge/discharge transistor and the select transistor, and thus, destruction of the gate insulating films may occur.

DETAILED DESCRIPTION

According to an embodiment, a nonvolatile semiconductor storage device is configured to include a memory cell array, word lines, bit lines, a sense amplifier, and peripheral transistors and enhancement type transistors in the memory cell array. In the memory cell array, memory cells are arranged in a cell well in a row direction and a column direction in a matrix. The memory cells are selected in the row direction by the word lines. The memory cells are selected in the column direction by the bit lines. The sense amplifier determines a value stored in the memory cell based on the potential of the bit line. The peripheral transistors in the memory cell array are formed in the cell well to be arranged in the vicinity of the memory cell array. The enhancement type transistor drives the gate of the peripheral transistor.

Hereinafter, the nonvolatile semiconductor storage device according to the embodiment will be described with reference to the drawings. In addition, the present invention is not limited to the embodiment.

First Embodiment

Figure 1:
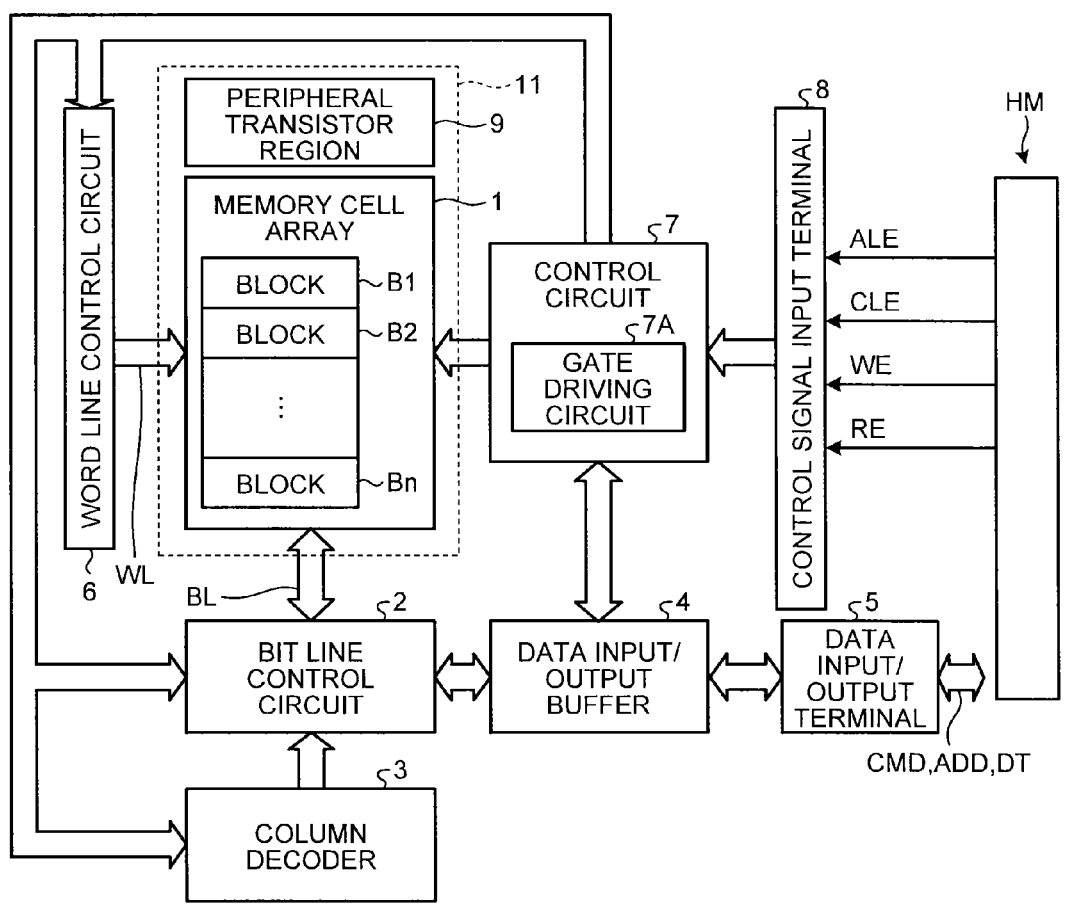
FIG. 1 is a block diagram illustrating a schematic configuration of a nonvolatile semiconductor storage device according to a first embodiment.

FIG. 1 is a block diagram illustrating a schematic configuration of a nonvolatile semiconductor storage device according to a first embodiment.

In FIG. 1, the memory cell array 1 includes a plurality of bit lines BL, a plurality of word lines WL, and a common source line, and for example, electrically data erasable and programmable memory cells such as EEPROM cells are arranged in a matrix. One memory cell may be configured so as to store 1-bit data, or one memory cell may be configured in a multi-level storage manner so as to store 2-bit or more data. The memory cell array 1 is divided into n (n is a positive integer) blocks B1 to Bn. Each of the blocks B1 to Bn may be configured so that a plurality of NAND cell units is arranged in the row direction. A bit control circuit 2 which controls the bit line BL and a word line control circuit 6 which controls the word lines WL are connected to the memory cell array 1.

The bit line control circuit 2 reads data of the memory cell in the memory cell array 1 through the bit line BL, detects the state of the memory cell in the memory cell array 1 through the bit line BL, or applies a write control voltage to the memory cell in the memory cell array 1 through the bit line BL to perform the write operation for the memory cell. A column decoder 3 and a data input/output buffer 4 are connected to the bit line control circuit 2. The data storage circuit in the bit line control circuit 2 is selected by the column decoder 3. The data of the memory cell read from the data storage circuit are output through the data input/output buffer 4 from a data input/output terminal 5 to an external portion (a host or a memory controller HM). Various commands CMD, addresses ADD, and data DT for controlling operations of a NAND type flash memory supplied from the host or the memory controller HM are input to the data input/output terminal 5. The write data input to the data input/output terminal 5 is supplied through the data input/output buffer 4 to the data storage circuit selected by the column decoder 3, and the commands CMD and the addresses ADD are supplied to the control circuit 7.

The word line control circuit 6 is connected to the memory cell array 1. The word line control circuit 6 selects a word line WL in the memory cell array 1 to apply a voltage necessary for writing, reading, or erasing to the selected word line WL.

The memory cell array 1, the bit line control circuit 2, the column decoder 3, the data input/output buffer 4, and the word line control circuit 6 are connected to the control circuit 7 to be controlled by the control circuit 7. The control circuit 7 is connected to the control signal input terminal 8 to be controlled based on a control signal ALE (address latch enable), a CLE (command latch enable), a WE (write enable), and an RW (read enable) input from the external portion through the control signal input terminal 8. The bit line control circuit 2, the column decoder 3, the word line control circuit 6, and the control circuit 7 constitute a write circuit and a read circuit.

The memory cell array 1 is arranged in a cell well 11 where a semiconductor substrate is formed. A high voltage of about 20 V may be applied to the cell well 11 during an erasing period of the memory cell. In addition, a peripheral transistor 9 arranged in the periphery of the memory cell array 1 is formed in the cell well 11.

A gate driving circuit 7A is installed in the control circuit 7. The gate driving circuit 7A can drive the gate of a transistor arranged in the peripheral transistor region 9. The gate driving circuit 7A allows the gate of the peripheral transistor 9 to be in the floating state during the erasing operation for the memory cell, so that a gate potential of the peripheral transistor 9 follows a well potential of the cell well 11. Therefore, it is possible to prevent a high voltage from being applied to the gate insulating film of the peripheral transistor 9.

Figure 2:
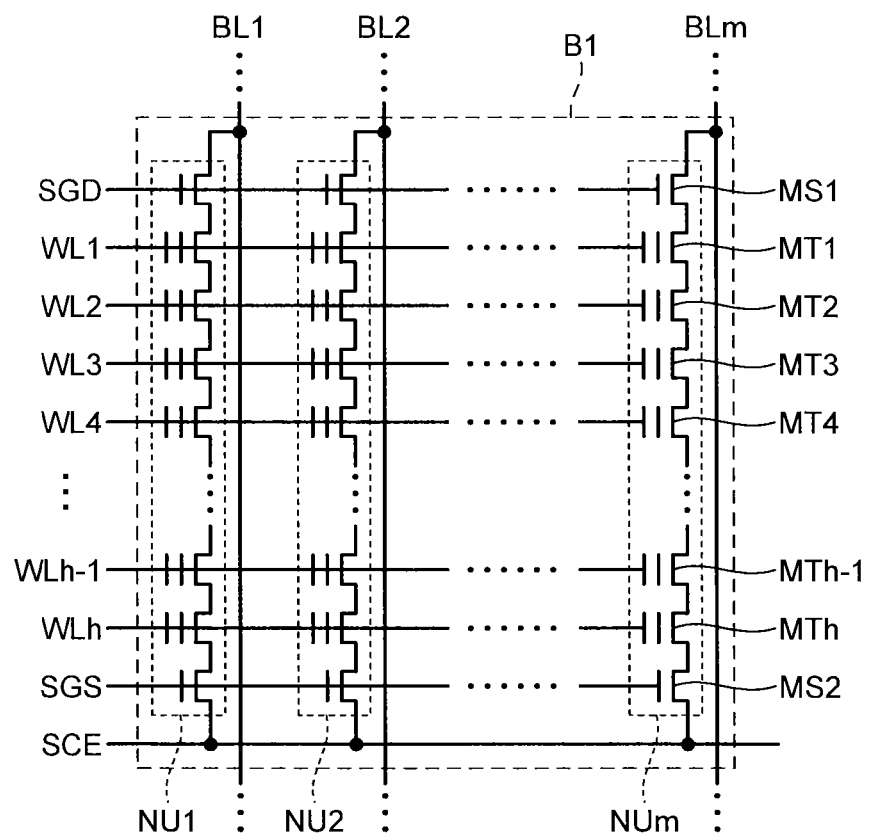
FIG. 2 is a circuit diagram illustrating a schematic configuration of a block of the nonvolatile semiconductor storage device illustrated in FIG. 1.

FIG. 2 is a circuit diagram illustrating a schematic configuration of a block of the nonvolatile semiconductor storage device illustrated in FIG. 1.

In FIG. 2, h (h is a positive integer) word lines WL1 to WLh, select gate lines SGD and SGS, and a source line SCE are installed in each of the blocks B1 to Bn. In addition, m (m is a positive integer) bit lines BL1 to BLm are commonly installed in each of the blocks B1 to Bn.

In addition, m NAND cell units NU1 to NUm are installed in each of the blocks B1 to Bn, and the NAND cell units NU1 to NUm are connected to the bit lines BL1 to BLm, respectively.

Cell transistors MT1 to MTh and select transistors MS1 and MS2 are installed in each of the NAND cell units NU1 to NUm. One memory cell in the memory cell array 1 may be configured by using one cell transistor. The cell transistors MT1 to MTh are connected in series to constitute the NAND string, and the select transistors MS1 and MS2 are connected to two ends of the NAND string to constitute each of the NAND cell units NU1 to NUm. A cell transistor adjacent to the select transistors MS1 and MS2 may be a dummy cell transistor. In addition, two or more dummy cell transistors may be used.

In each of the NAND cell units NU1 to NUm, word lines WL1 to WLh are connected to the control gate electrodes of the cell transistors MT1 to MTh. In addition, each of the NAND cell units NU1 to NUm, the one end of the NAND string including the cell transistors MT1 to MTh is connected through the select transistor MS1 to the bit lines BL1 to BLm; and the other end of the NAND string is connected through the select transistor MS2 to the source line SCE.

Figure 3:
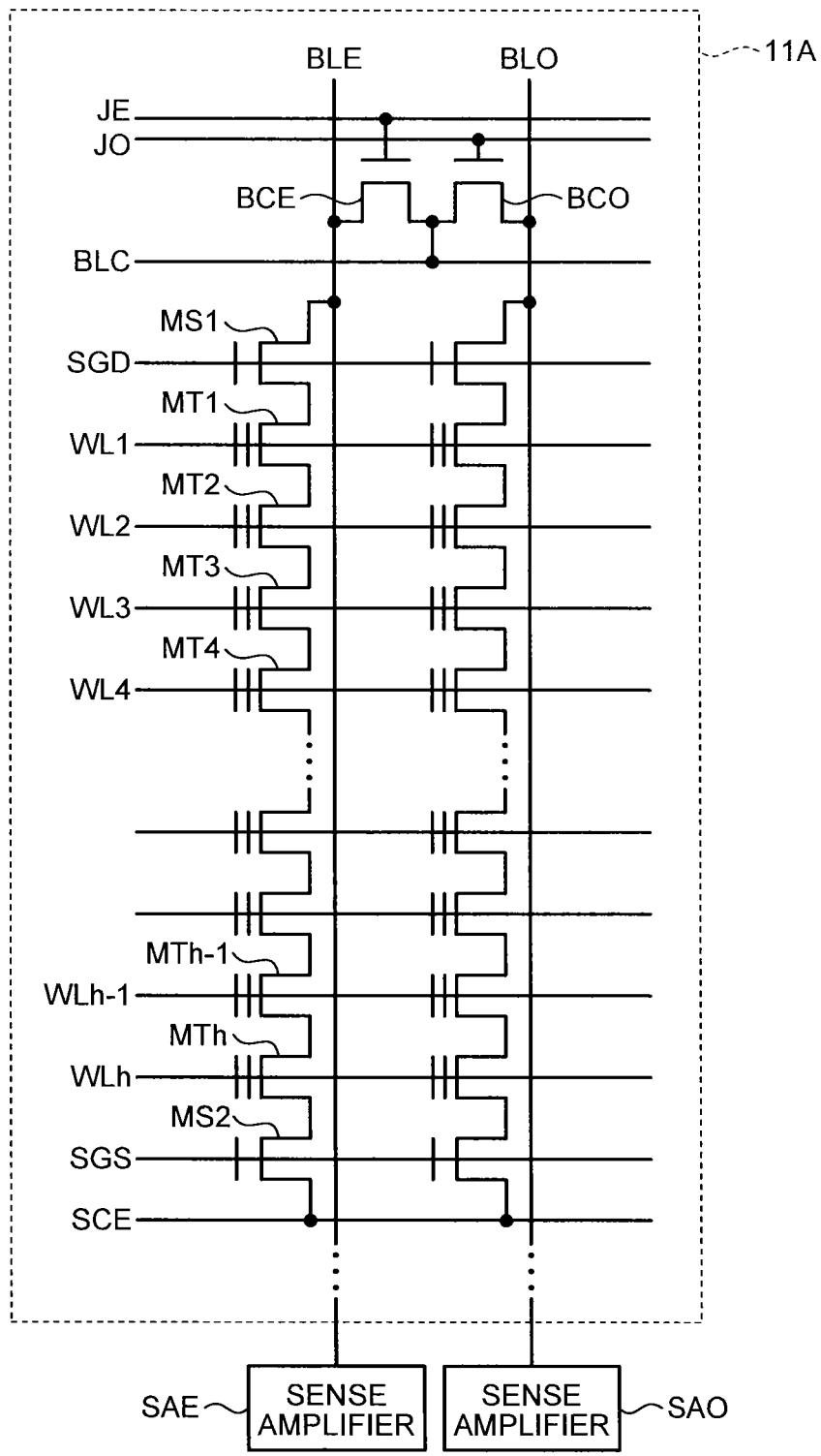
FIG. 3 is a circuit diagram illustrating an example of arrangement of charge/discharge transistors in a cell well where a memory cell array illustrated in FIG. 1 is arranged.

FIG. 3 is a circuit diagram illustrating an example of arrangement of charge/discharge transistors in a cell well where a memory cell array illustrated in FIG. 1 is arranged. In the example of FIG. 3, two adjacent bit lines BLE and BLO are illustrated. The bit line BLE denotes an even-numbered bit line among the bit lines BL1 to BLm illustrated in FIG. 2, and the bit line BLO denotes an odd-numbered bit line among the bit lines BL1 to BLm illustrated in FIG. 2.

In FIG. 3, the cell transistors MT1 to MTh and the select transistors MS1 and MS2 are formed inside the cell well 11A. The sense amplifier SAE and SAO are formed in a region other than the cell well 11A. The bit lines BLE and BLO are connected to the sense amplifier SAE and SAO, respectively. In addition, in the cell well 11A, the charge/discharge transistors BCE and BCO are formed in the periphery of the memory cell array 1.

The drain of the charge/discharge transistor BCE is connected to the bit line BLE, and the gate of the charge/discharge transistor BCE is connected to a control line JE. The drain of the charge/discharge transistor BCO is connected to the bit line BLO, and the gate of the charge/discharge transistor BCO is connected to a control line JO. The source of the charge/discharge transistors BCE and BCO is connected to a control line BLC. The control line BLC may be configured to have a ground voltage potential, a cell source potential, or an arbitrary voltage. In addition, the control line BLC may be connected to the source line SCE.

In order to reset the potentials of the bit lines BLE and BLO after the write operation, the read operation, and the erase operation for the memory cell, the discharge operation for the bit lines BLE and BLO is performed. In addition, in the write operation, the charge operation for a non-selected bit line connected to a non-selected NAND unit is performed.

At this time, the charge/discharge transistors BCE and BCO charge or discharge the bit lines BLE and BLO in cooperation with the charge/discharge operation for the bit lines BLE and BLO by the sense amplifier SAE and SAO. Accordingly, in comparison with the case where charging and discharging of the bit lines BLE and BLO are performed only by the sense amplifier SAE and SAO, it is possible to shorten a charge/discharge time, so that it is possible to increase the speed of the charge/discharge operation.

Figure 4:
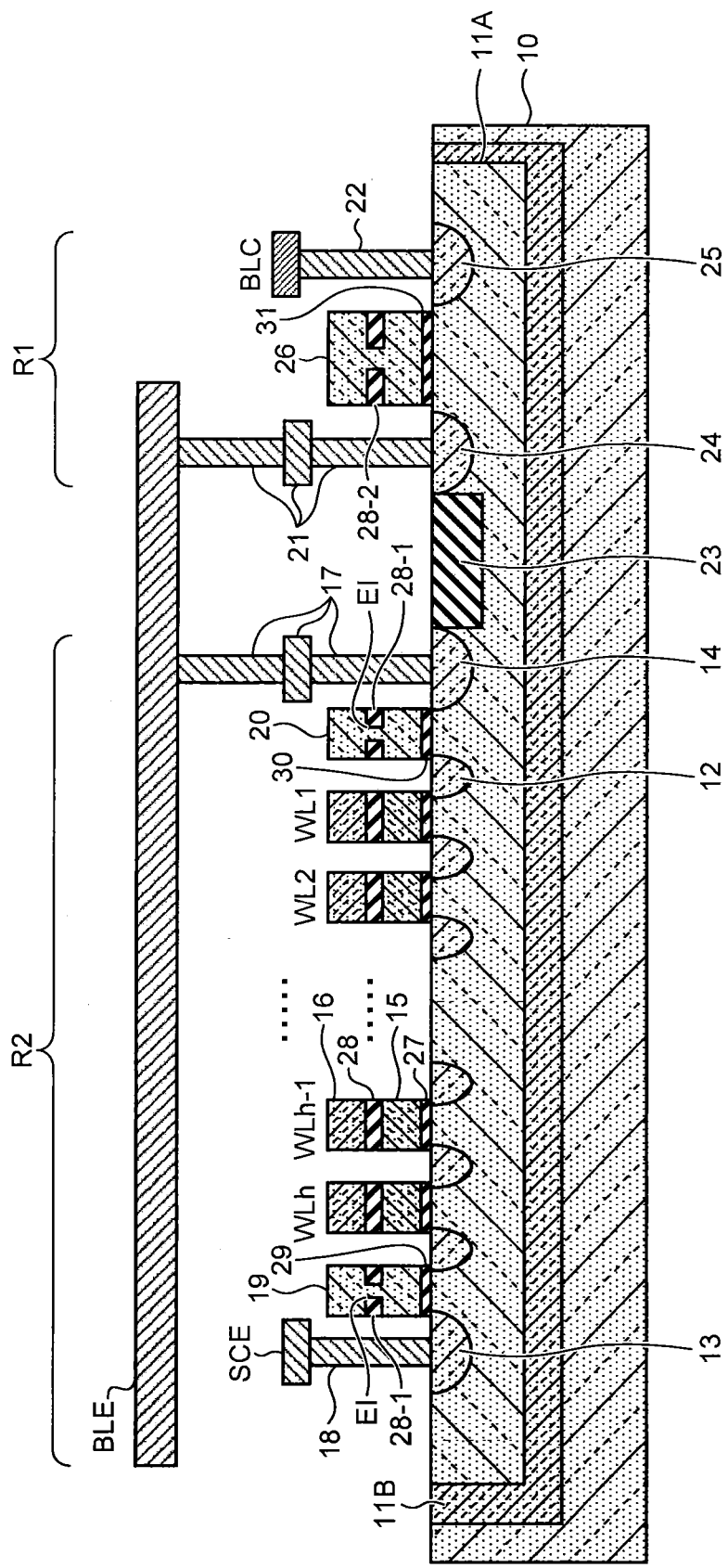
FIG. 4 is a cross-sectional diagram illustrating a schematic configuration of an NAND string and a charge/discharge transistor illustrated in FIG. 3.

FIG. 4 is a cross-sectional diagram illustrating a schematic configuration of an NAND string and a charge/discharge transistor illustrated in FIG. 3.

In FIG. 4, for example, an n-type buried well 11B is formed in a semiconductor substrate 10. For example, a p-type cell well 11A is formed in the buried well 11B, and a memory cell array region R2 and a peripheral transistor region R1 are installed in the cell well 11A. As a material of the semiconductor substrate 10, for example, Si, Ge, SiGe, GaAs, AlGaAs, InP, GaP, InGaAs, GaN, SiC, or the like may be selected. An element isolation layer 23 is formed in the cell well 11A. The memory cell array region R2 and the peripheral transistor region R1 are isolated by the element isolation layer 23. For example, an STI (Shallow Trench Isolation) structure may be used for the element isolation layer 23.

In the memory cell array region R2, on the cell well 11A, a charge storage layer 15 is arranged through a tunnel insulating film 27, and select gate electrodes 19 and 20 are arranged through gate insulating films 30 and 31. In addition, a control gate electrode 16 is arranged through an intermediate insulating film 28 on the charge storage layer 15, and the one charge storage layer 15 and the control gate electrode 16 thereon may constitute one memory cell. An intermediate insulating film 28-1 having an opening EI is arranged in each of the select gate electrodes 19 and 20. In other words, each of the select gate electrodes 19 and 20 can be divided into an upper electrode and a lower electrode by the intermediate insulating film 28-1, and the upper electrode and the lower electrode are electrically connected to each other by the opening EI. The intermediate insulating film 28 and the intermediate insulating film 28-1 may be configured by using the same material.

In the cell well 11A, an impurity diffusion layer (source/drain region) 12 is formed to be arranged between the charge storage layers 15 or between the charge storage layer 15 and the select gate electrodes 19 and 20, and impurity diffusion layer (source region) 13 and impurity diffusion layer (drain region) 14 are formed to be arranged on the sides of the select gate electrodes 19 and 20.

The impurity diffusion layer 14 is connected through a contact electrode 17 to the bit line BL, and the impurity diffusion layer 13 is connected through a contact electrode 18 to the source line SCE. The control gate electrodes 16 of the memory cells are connected to the word lines WL1 to WLh, and the select gate electrodes 19 and 20 are connected to the select gate lines SGD and SGS, respectively.

On the other hand, in the peripheral transistor region R1, on the cell well 11A, a gate electrode 26 is formed through a gate insulating film 31. An intermediate insulating film 28-2 having an opening EI is arranged in the gate electrode 26. In other words, the gate electrode 26 can be divided into an upper electrode and a lower electrode by the intermediate insulating film 28-2, and the upper electrode and the lower electrode are electrically connected to each other by the opening EI. The intermediate insulating film 28, the intermediate insulating film 28-1, and the intermediate insulating film 28-2 may be configured by using the same material. In the cell well 11A, impurity diffusion layer (drain region) 24 and impurity diffusion layer (source region) 25 are formed to interpose a channel region under the gate electrode 26. For example, the cell well 11A may be formed in a P type, and the impurity diffusion layers 12, 13, 14, 24, and 25 may be formed in an N type. The impurity diffusion layer 24 is connected through a contact electrode 21 to the bit line BL, and the impurity diffusion layer 25 is connected through a contact electrode 22 to the control line BLC. The gate electrode 26 and the impurity diffusion layers 24 and 25 may constitute, for example, the charge/discharge transistor BCE illustrated in FIG. 3.

The tunnel insulating film 27 and the gate insulating films 29 to 31 may be set to have the same thickness. Since the charge/discharge transistor BCE is formed in the cell well 11A installed in the memory cell array region R2, in comparison with the case where the charge/discharge transistor BCE is formed in a region other than the cell well 11A, the charge/discharge transistor BCE can be configured in a low voltage resistant manner, so that it is possible to reduce a layout area of the charge/discharge transistor BCE.

Figure 5:
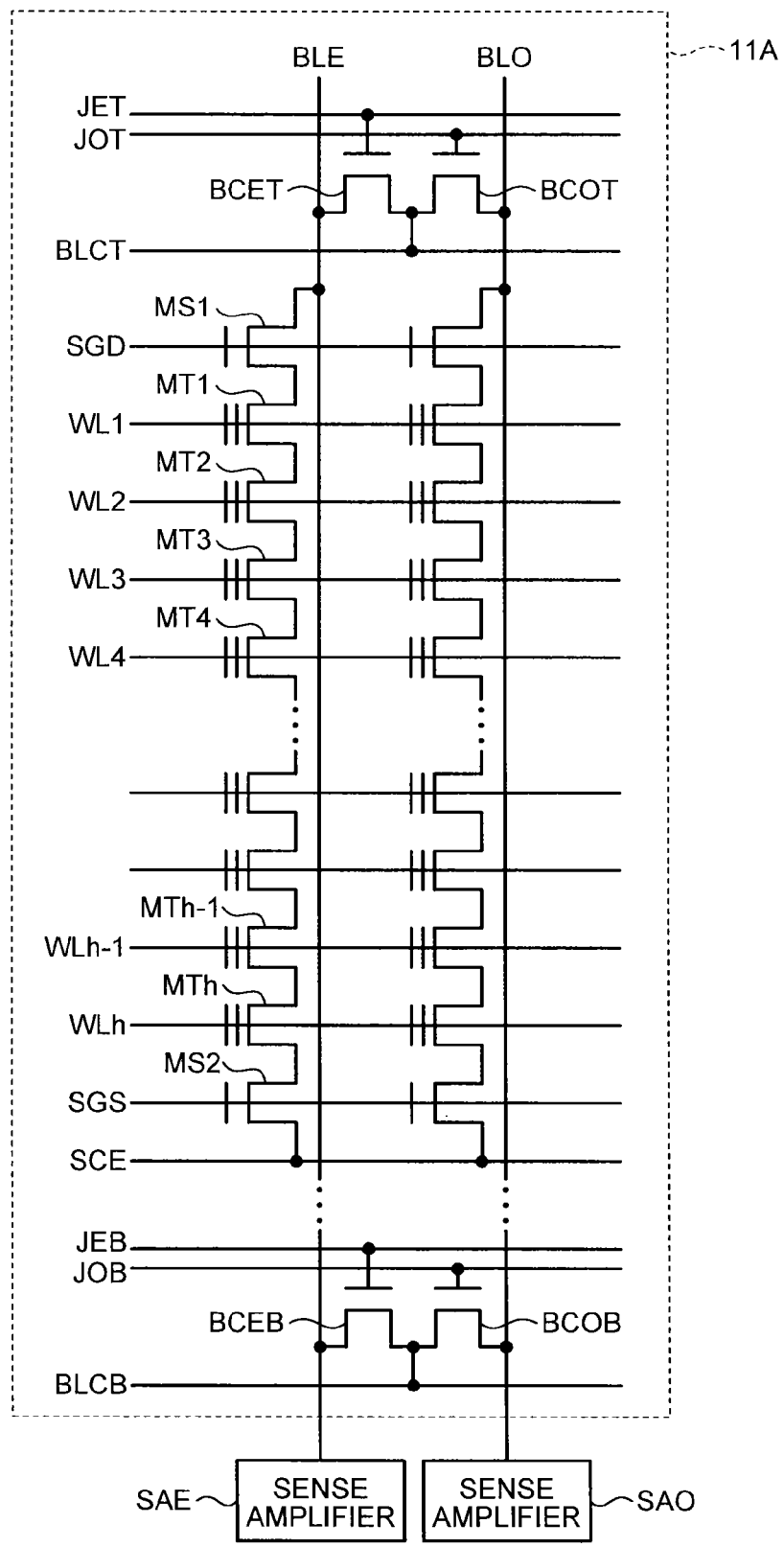
FIG. 5 is a circuit diagram illustrating another example of arrangement of charge/discharge transistors in a cell well where a memory cell array illustrated in FIG. 1 is arranged.

FIG. 5 is a circuit diagram illustrating another example of arrangement of the charge/discharge transistors in the cell well where the memory cell array illustrated in FIG. 1 is arranged. In the example illustrated in FIG. 5, two adjacent bit lines BLE and BLO are illustrated.

In FIG. 5, the cell transistors MT1 to MTh and the select transistors MS1 and MS2 are formed in the cell well 11A. The sense amplifiers SAE and SAO are formed in a region other than the cell well 11A. The bit lines BLE and BLO are connected to the sense amplifiers SAE and SAO, respectively. In the cell well 11A, charge/discharge transistors BCET, BCOT, BCEB, and BCOB are formed in the peripheral transistor region R1 arranged in the periphery of the memory cell array region R2.

The drain of the charge/discharge transistor BCET is connected to the one end of the bit line BLE, and the gate of the charge/discharge transistor BCET is connected to a control line JET. The drain of the charge/discharge transistor BCOT is connected to the one end of the bit line BLO, and the gate of the charge/discharge transistor BCOT is connected to a control line JOT. The sources of the charge/discharge transistors BCET and BCOT are connected to a control line BLCT. The drain of the charge/discharge transistor BCEB is connected to the other end of the bit line BLE, and the gate of the charge/discharge transistor BCEB is connected to a control line JEB. The drain of the charge/discharge transistor BCOB is connected to the other end of the bit line BLO, and the gate of the charge/discharge transistor BCOB is connected to a control line JOB. The sources of the charge/discharge transistors BCEB and BCOB are connected to a control line BLCB. The control circuit 7 can allow the control lines BLCT and BLCB to have a ground voltage potential, a cell source potential, or an arbitrary voltage. The control circuit 7 can allow the source line SCE to have a potential for connection, a cell source potential, or an arbitrary voltage.

The charge/discharge transistors BCET, BCEB, BCOT, and BCOB charge or discharge the bit lines BLE and BLO in cooperation with the charge/discharge operation for the bit lines BLE and BLO by the sense amplifiers SAE and SAO. Accordingly, in comparison with the case where charging and discharging of the bit lines BLE and BLO are performed only by the sense amplifier circuits SAE and SAO, it is possible to shorten a charge/discharge time, so that it is possible to increase the speed of the charge/discharge operation.

Figure 6:
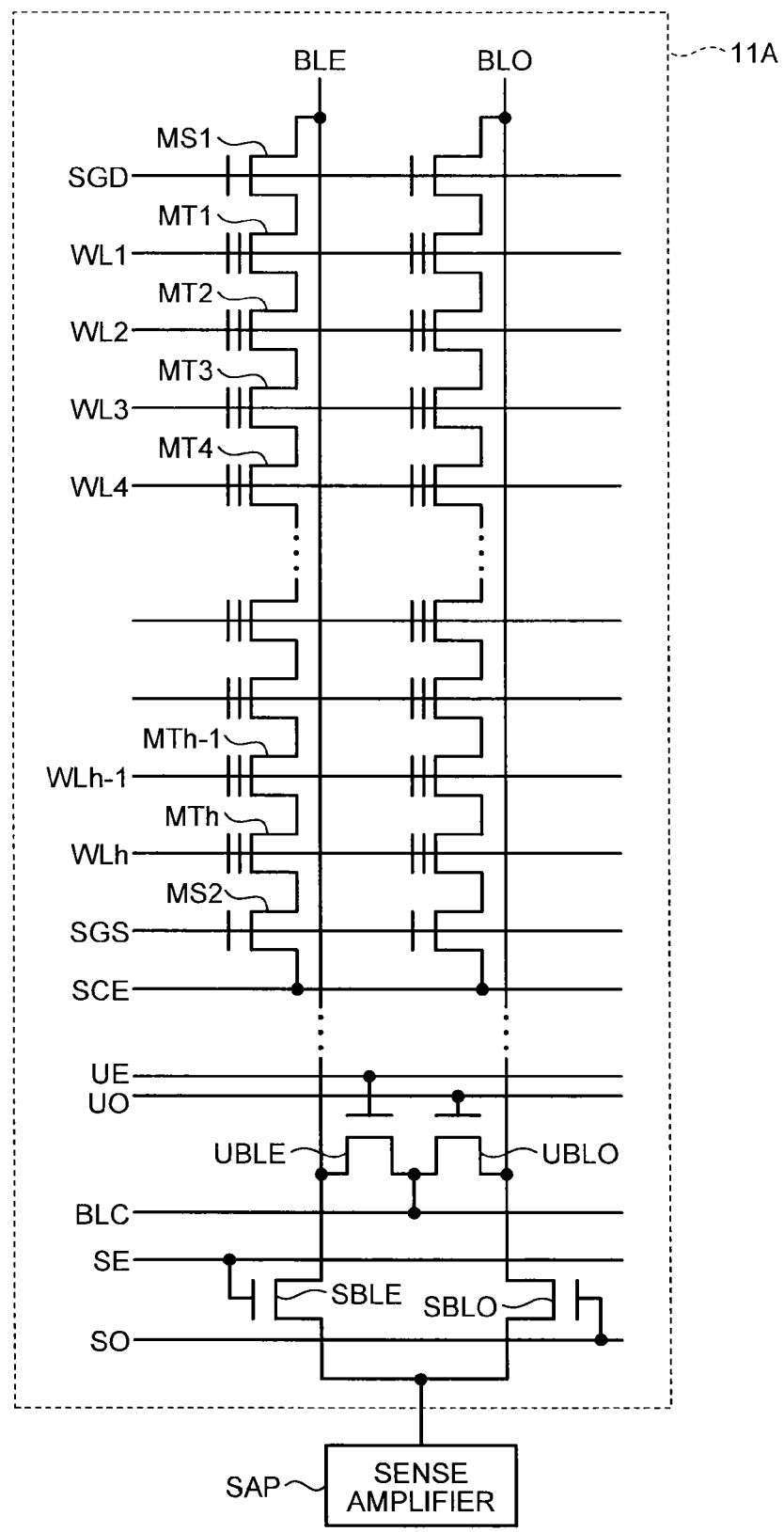
FIG. 6 is a circuit diagram illustrating an example of arrangement of switching transistors and select transistors in a cell well where a memory cell array illustrated in FIG. 1 is arranged.

FIG. 6 is a circuit diagram illustrating an example of arrangement of the charge/discharge transistor and the switching transistors in the memory cell array region R2 where the memory cell array illustrated in FIG. 1 is arranged. In the example illustrated in FIG. 6, two adjacent bit lines BLE and BLO are illustrated.

In FIG. 6, the cell transistors MT1 to MTh and the select transistors MS1 and MS2 are formed in the cell well 11A. A sense amplifier SAP is formed in a region other than the cell well 11A. The sense amplifier SAP is shared by the bit lines BLE and BLO. In the peripheral transistor region R1 of the cell well 11A, the charge/discharge-transistor switching transistors UBLE and UBLO and the switching transistor select transistors SBLE and SBLO are formed in the periphery of the memory cell array 1.

The drain of the charge/discharge-transistor switching transistor UBLE is connected to the bit line BLE, and the gate of the charge/discharge-transistor switching transistor UBLE is connected a control line UE. The drain of the charge/discharge-transistor switching transistor UBLO is connected to the bit line BLO, and the gate of the charge/discharge-transistor switching transistor UBLO is connected to a control line UO. The sources of the charge/discharge-transistor switching transistors UBLE and UBLO are connected to a control line BLC. The control circuit 7 can allow the control line BLC to have a ground voltage potential, a cell source potential, or an arbitrary voltage. The control circuit 7 can allow the source line SCE to have a potential for connection, a cell source potential, or an arbitrary voltage.

The drain of the switching transistor select transistor SBLE is connected to the bit line BLE, and the gate of the switching transistor select transistor SBLE is connected to a control line SE. The drain of the switching transistor select transistor SBLO is connected to the bit line BLO, and the gate of the select transistor SBLO is connected to a control line SO. The sources of the switching transistor select transistors SBLE and SBLO are connected to the sense amplifier SA.

In addition, selection and non-selection of the even-numbered bit line BLE and the odd-numbered bit line BLO can be alternately switched. For example, in the case where the even-numbered bit line BLE is selected, by allowing the switching transistor select transistor SBLE to be turned on and allowing the charge/discharge-transistor switching transistor UBLE to be turned off, the bit line BLE is connected to the sense amplifier SA. At this time, by allowing the switching transistor select transistor SBLO to be turned off and allowing the charge/discharge-transistor switching transistor UBLE to be turned on, the bit line BLO is disconnected from the sense amplifier SA, so that the potential of the bit line BLO is fixed to a predetermined potential through the control line BLC.

Therefore, during the read period for the memory cell, it is possible to use the non-selected bit line as noise shield, or during the write period for the memory cell, it is possible to reduce inter-bit interference.

Figure 7:
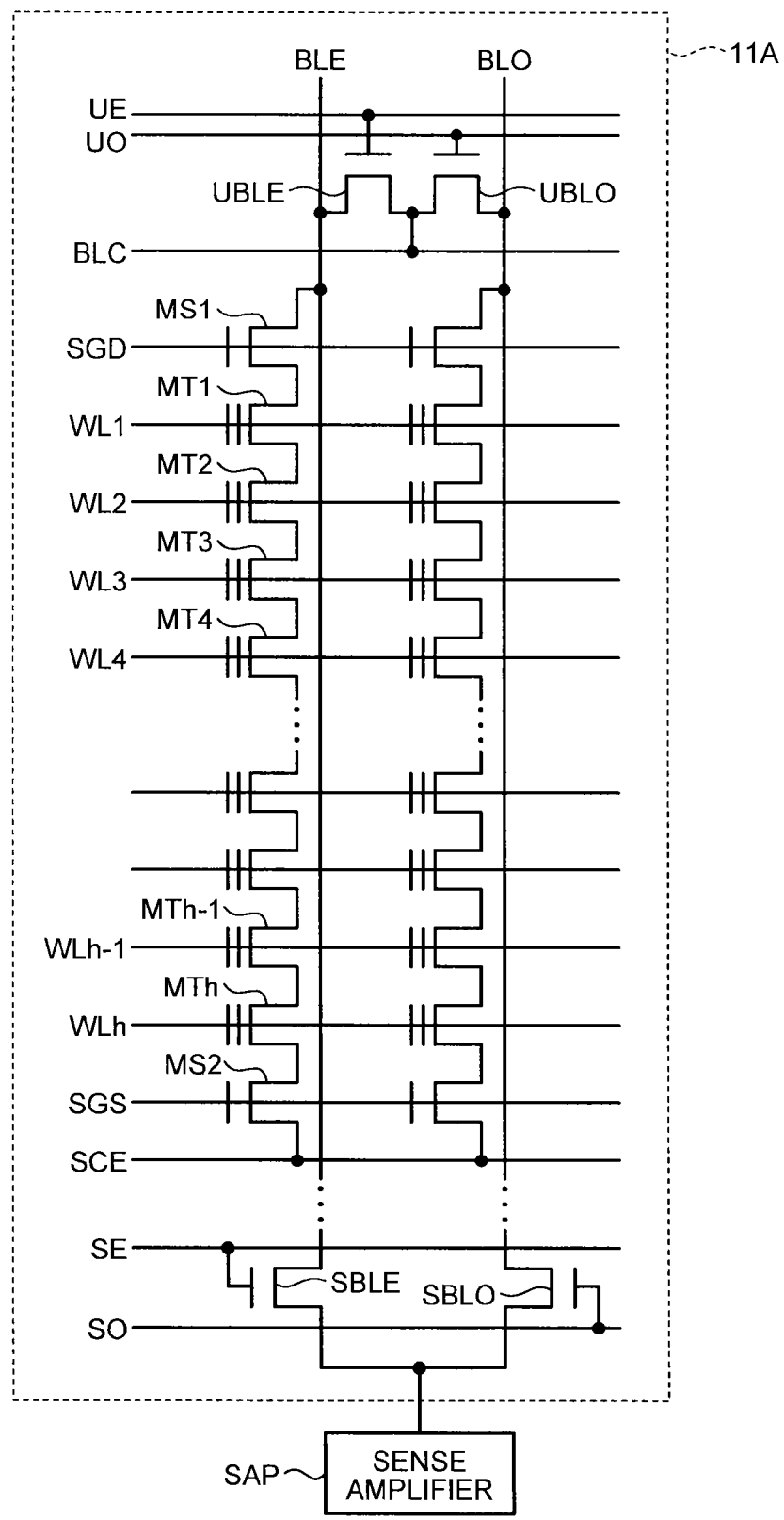
FIG. 7 is a circuit diagram illustrating another example of arrangement of switching transistors and select transistors in a cell well where a memory cell array illustrated in FIG. 1 is arranged.

FIG. 7 is a circuit diagram illustrating another example of arrangement of the switching transistors and the select transistors in the cell well where the memory cell array illustrated in FIG. 1 is arranged. In the example illustrated in FIG. 7, two adjacent bit lines BLE and BLO are illustrated.

In FIG. 7, the cell transistors MT1 to MTh and the select transistors MS1 and MS2 are formed in the cell well 11A. The sense amplifier SA is formed in a region other than the cell well 11A. The sense amplifier SA is shared by the bit lines BLE and BLO. In the cell well 11A, the charge/discharge-transistor switching transistors UBLE and UBLO and the switching transistor select transistors SBLE and SBLO are formed in the periphery of the memory cell array 1.

In the example illustrated in FIG. 7, the charge/discharge-transistor switching transistors UBLE and UBLO and the switching transistor select transistors SBLE and SBLO are arranged in the side of the sense amplifier SAP. On the other hand, in the example illustrated in FIG. 7, the switching transistor select transistors SBLE and SBLO are arranged in the side of the sense amplifier SAP, and the charge/discharge-transistor switching transistors UBLE and UBLO are arranged in the side opposite to the sense amplifier SAP. Other configurations are the same as those illustrated in FIG. 6.

Figure 8:
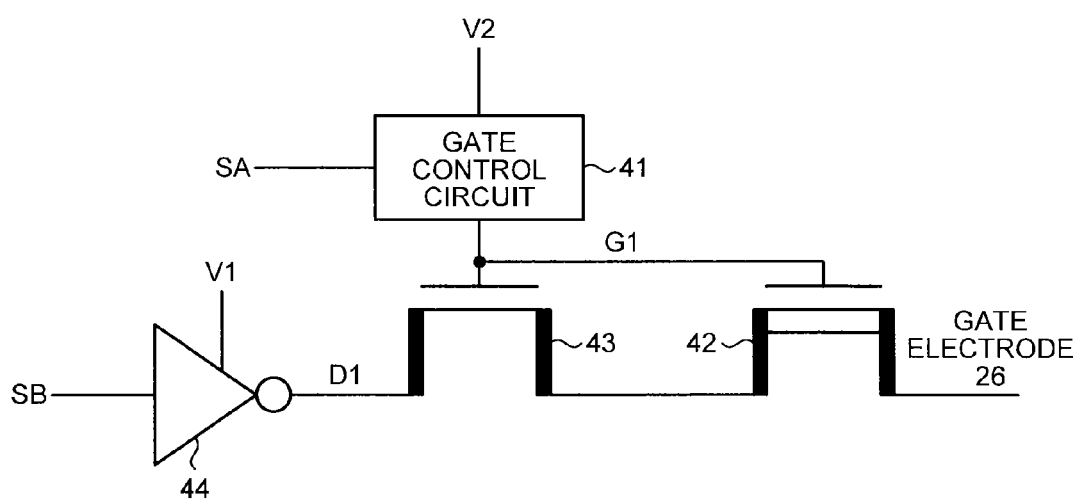
FIG. 8 is a block diagram illustrating a schematic configuration of a gate driving circuit 7A illustrated in FIG. 1.

FIG. 8 is a block diagram illustrating a schematic configuration of the gate driving circuit 7A illustrated in FIG. 1.

In FIG. 8, a gate control circuit 41, a depletion type transistor 42, an enhancement type transistor 43, and an inverter circuit 44 are installed in the gate driving circuit 7A. The gate control circuit 41 can control turning-on and turning-off of the depletion type transistor 42 and the enhancement type transistor 43 based on a control signal SA. The inverter circuit 44 can supply a potential voltage V1 (for example, about 4 V) to the drain of the enhancement type transistor 43 based on a control signal SB. In the case of turning on the depletion type transistor 42 and the enhancement type transistor 43, the gate control circuit 41 can supply a potential voltage V2 (for example, about 8 V) to the gates of the depletion type transistor 42 and the enhancement type transistor 43. In addition, V2 may be set to be higher than V1+Vet. Herein, Vet is a threshold voltage level of the enhancement type transistor 43.

The drain of the depletion type transistor 42 is connected to the gate of the peripheral transistor 9 arranged in the peripheral transistor region R1 of the cell array. For example, in the case where the peripheral transistor 9 in the peripheral transistor region R1 is the charge/discharge transistor BCE illustrated in FIG. 3, the peripheral transistor 9 can be connected to the gate electrode 26 illustrated in FIG. 4. In addition, the peripheral transistor 9 may be the charge/discharge transistors BCE and BCO illustrated in FIG. 3, the charge/discharge transistor BCET, BCOT, BCEB, and BCOB illustrated in FIG. 5, the charge/discharge-transistor switching transistors UBLE and UBLO or the switching transistor select transistors SBLE and SBLO illustrated in FIG. 6, and the charge/discharge-transistor switching transistors UBLE and UBLO or the switching transistor select transistors SBLE and SBLO illustrated in FIG. 6.

The enhancement type transistor 43 is connected in series to the depletion type transistor 42, and the output of the inverter circuit 44 is connected to the drain of the enhancement type transistor 43. The gate control circuit 41 is connected to the gates of the depletion type transistor 42 and the enhancement type transistor 43.

Figure 9A:
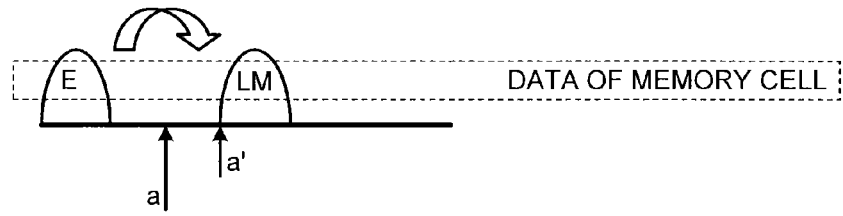
FIGS. 9A, 9B, and 9C are diagrams illustrating a relation between data and a threshold voltage in the case where 2-bit data are stored in a memory cell.
Figure 9B:
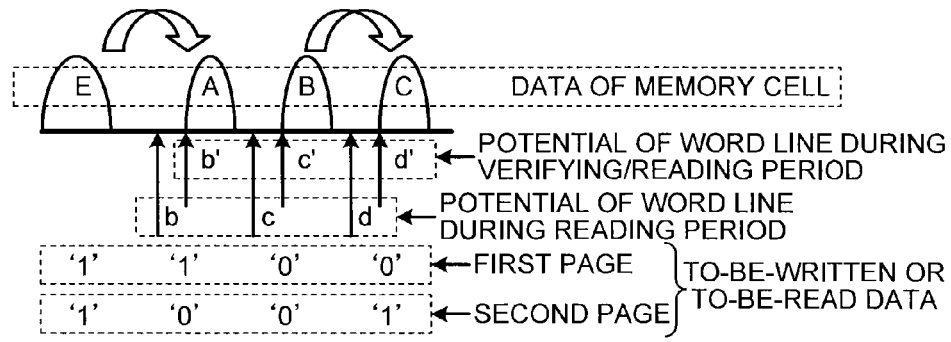
Figure 9C:
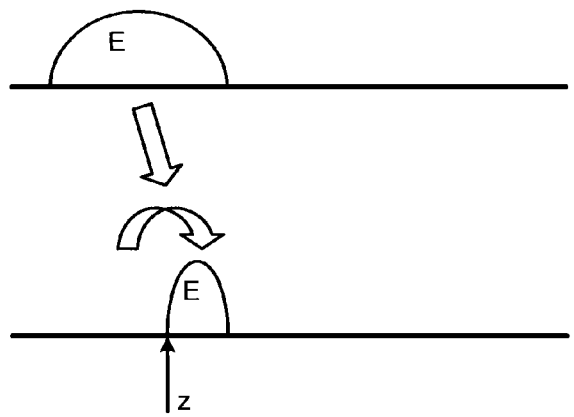

FIGS. 9A, 9B, and 9C are diagrams illustrating a relationship between data and threshold voltage in the case where 2-bit data are stored in a memory cell.

In FIGS. 9A, 9B, and 9C, when the erase operation is performed, as illustrated in FIG. 9C, the threshold level distribution of the memory cell becomes a threshold level distribution "E". After erasing, in order to reduce the spread of the threshold level distribution, for example, writing is performed by using a verifying level "z". The threshold level distribution "E" is set to, for example, negative threshold voltage distribution. However, the write operation for reducing the spread of the threshold level distribution after erasing is not necessarily performed.

As illustrated in FIG. 9A, in the writing for a first page, in the case where the write data are "1", the threshold level distribution of the memory cell is threshold level distribution "E"; and in the case where the write data are "0", the threshold level distribution of the memory cell is increased, and intermediate distribution "LM" is formed.

As illustrated in FIG. 9B, after the writing for a second page, the data of the memory cell become one of threshold level distributions "E", "A", "B", and "C" according to the write data. In other words, in the case where the data of the memory cell after the writing for the first page are "0" and the write data of the second write data are "1", the threshold level distribution of the memory cell are the threshold level distribution "E"; and in the case where the write data are "0", the threshold level distribution of the memory cell becomes the threshold level distribution "A". In addition, in the case where the data of the memory cell after the writing for the first page are "1" and the write data are "0", the threshold level distribution of the memory cell becomes the threshold level distribution "B"; and in the case where the write data are "1", the threshold level distribution of the memory cell becomes the threshold level distribution "C". In the embodiment, the data of the memory cell are defined from a low threshold voltage side to a high threshold voltage side. IN addition, the threshold level distributions "LM", "A", "B", and "C" may be configured with positive threshold voltages, or the threshold level distributions "LM", "A", "B", and "C" may be configured with a mixture of negative and positive threshold voltages.

Figure 10:
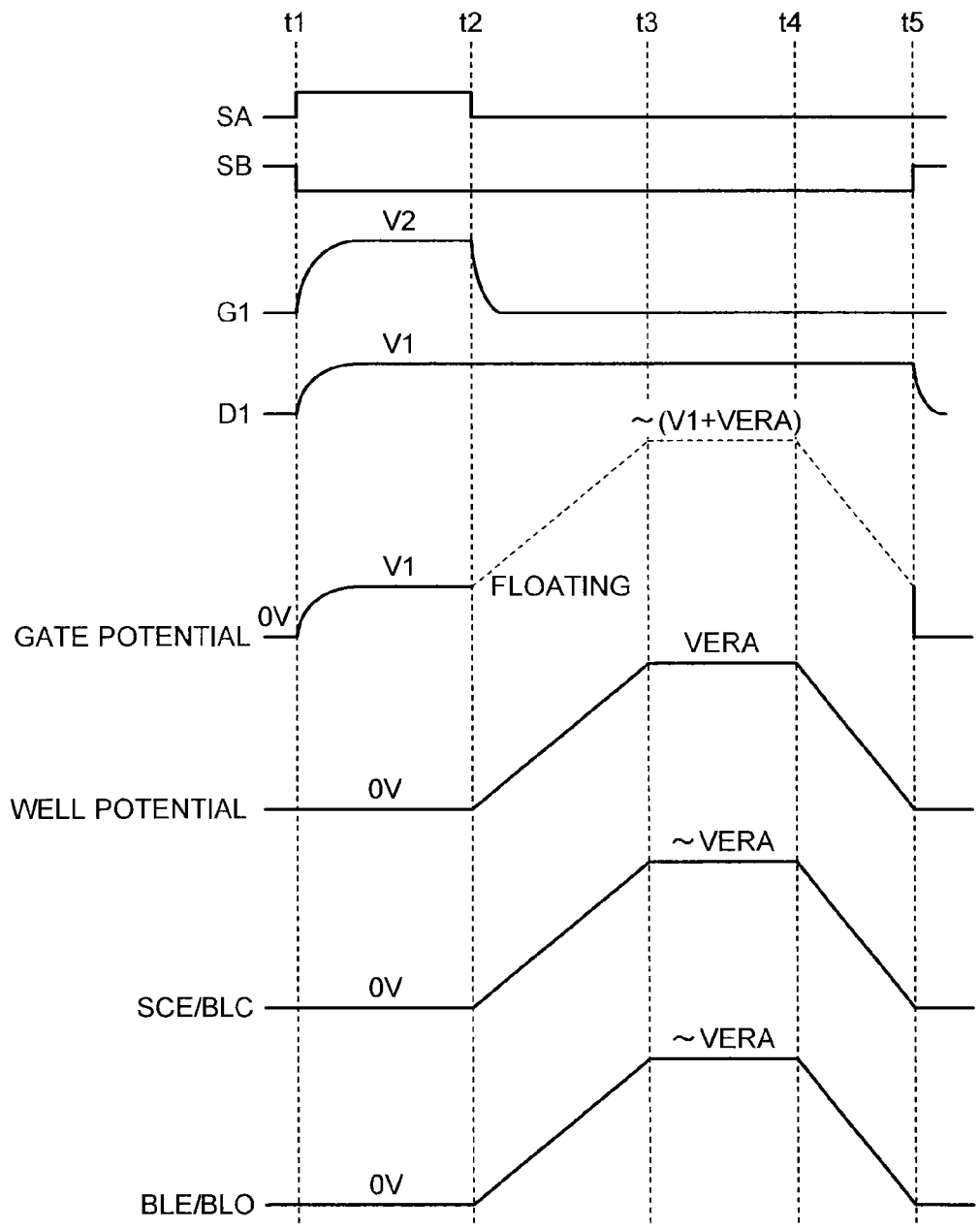
FIG. 10 is a timing chart illustrating voltage waveforms of components of the memory cell array illustrated in FIG. 3 and the gate driving circuit 7A illustrated in FIG. 8 during an erasing period of the memory cell illustrated in FIG. 3.

FIG. 10 is a timing chart illustrating voltage waveforms of components of the memory cell array illustrated in FIG. 3 and the gate driving circuit 7A illustrated in FIG. 8 during an erasing period of the memory cell illustrated in FIG. 3.

In FIG. 10, during an erasing period of the memory cell, if a rising edge occurs in the control signal SA (t1), a gate voltage G1 is set to a potential voltage V2, so that the depletion type transistor 42 and the enhancement type transistor 43 are allowed to be turned on. At this time, if a falling edge occurs in the control signal SB (t1), a source voltage D1 is set to a voltage potential V1, so that the voltage potential V1 is applied through the depletion type transistor 42 and the enhancement type transistor 43, for example, to the gate electrode 26 of the charge/discharge transistor BCE illustrated in FIG. 3. Therefore, the voltage potential V1 is transferred to the gate of the charge/discharge transistor BCE, so that initial charging is performed.

Next, if a falling edge occurs in the control signal SA (t2), the gate voltage G1 is set to, for example, 0 V, so that the depletion type transistor 42 and the enhancement type transistor 43 are turned off. Therefore, the gate electrode 26 of the charge/discharge transistor BCE is set to a floating state. In addition, almost at the same time, the control unit 7 starts to apply a voltage to the cell well 11A, so that the well potential voltage applied to the cell well 11A starts to be increased. In addition, the potential of the charge/discharge transistor BCE and the like formed on the cell well 11A also starts to be increased. After that, the well potential voltage of the cell well 11A is increased up to an erase voltage VERA (for example, 20 V) (t3) to be maintained for a certain time.

At this time, if the voltage which the control unit 7 applies to the control gate electrode 16 is set to, for example, 0 V, a high voltage is applied between the cell well 11A of the memory cell of the selected block and the control gate electrode 16. Therefore, electric charges which are stored in the charge storage layer 15 of the memory cell of the selected block are extracted to the side of the cell well 11A, so that the write operation for the memory cell of the selected block is performed. On the other hand, in the case where electric charges are not to be extracted from the charge storage layer 15 of the memory cell, the control unit 7 allows the control gate electrode 16 to be in a floating state.

Since the gate electrode 26 of the charge/discharge transistor BCE is set to a floating state, the gate potential of the gate electrode 26 follows the well potential voltage of the cell well 11A so as to be about V1+VERA.

In addition, since the source line SCE, the control line BLC, and the bit lines BLE and BLO of the selected block are set to a floating state, the potentials thereof follow the well potential voltage of the cell well 11A so as to be about VERA.

Figure 11:
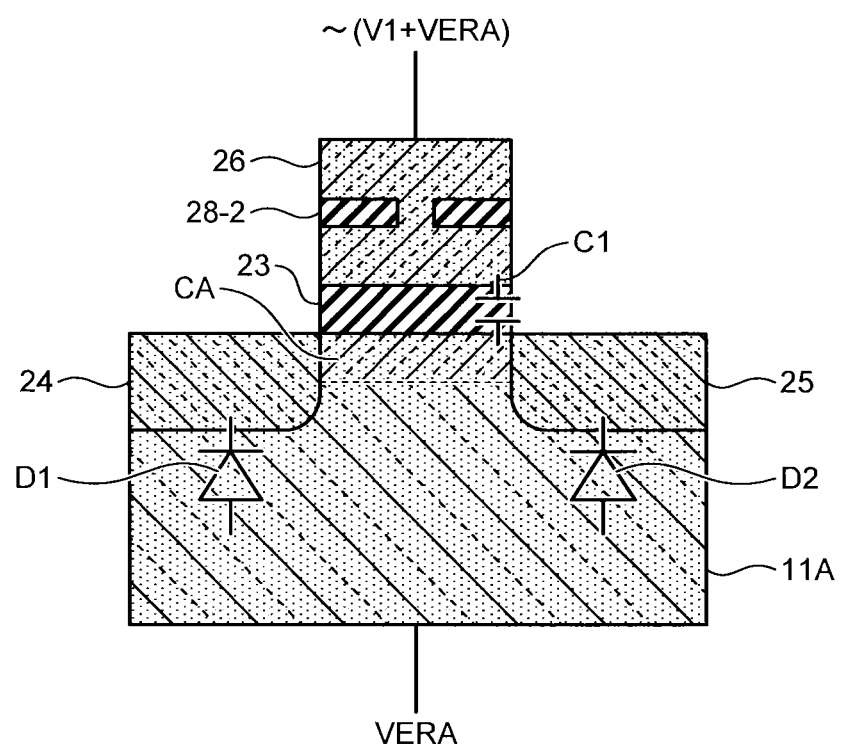
FIG. 11 is a cross-sectional diagram illustrating a state of a charge/discharge transistor during an erasing period of the memory cell illustrated in FIG. 3.

FIG. 11 is a cross-sectional diagram illustrating a state of the charge/discharge transistor during an erasing period of the memory cell illustrated in FIG. 3.

In FIG. 11, a parasitic diode D1 is formed between the cell well 11A of the charge/discharge transistor BCE and the impurity diffusion layer 24, and a parasitic diode D2 is formed between the cell well 11A and the impurity diffusion layer 25. In addition, a gate insulating film capacitance C1 is formed between the gate electrode 26 and the cell well 11A. If a predetermined potential voltage V1 is applied to the gate electrode 26, the initial charging of the gate electrode 26 is performed, so that a channel CA is formed between the impurity diffusion layers 24 and 25 under the gate electrode 26.

If the well voltage potential of the cell well 11A is set to an erase voltage VERA in this state, the potential of the gate electrode 26 follows the well voltage potential of the cell well 11A through the gate insulating film capacitance C1 so as to be about V1+VERA. Before the well potential voltage of the cell well 11A is set to the erase voltage VERA, since the channel CA is formed under the gate electrode 26, the gate electrode 26 and the cell well 11A can be effectively coupled in capacitance through the gate insulating film capacitance C1, so that the potential of the gate electrode 26 can be allowed to follow the well voltage potential of the cell well 11A.

Next, if the erasing for the memory cell is performed, a falling edge occurs in the well voltage potential of the cell well 11A (t4), so that the well voltage potential is set to 0 V (t5). Since the gate electrode 26 of the charge/discharge transistor BCE is set to a floating state, the gate potential of the gate electrode 26 follows the well voltage potential of the cell well 11A so as to be about 0 V. In addition, the potentials of the source line SCE, the control line BLC, and the bit lines BLE and BLO of the selected block follow the well voltage potential of the cell well 11A so as to be 0 V.

In the case where the well voltage potential of the cell well 11A is set to the erase voltage VERA, the gate electrode 26 of the charge/discharge transistor BCE is allowed to be in a floating state, so that the gate potential of the charge/discharge transistor BCE can be allowed to follow the well potential voltage of the cell well 11A. Therefore, since it is possible to prevent a high voltage from being applied to the gate insulating film 31 of the charge/discharge transistor BCE, even in the case where the charge/discharge transistor BCE is configured in a low voltage resistant manner, it is possible to prevent destruction of the charge/discharge transistor BCE.

Figure 12:
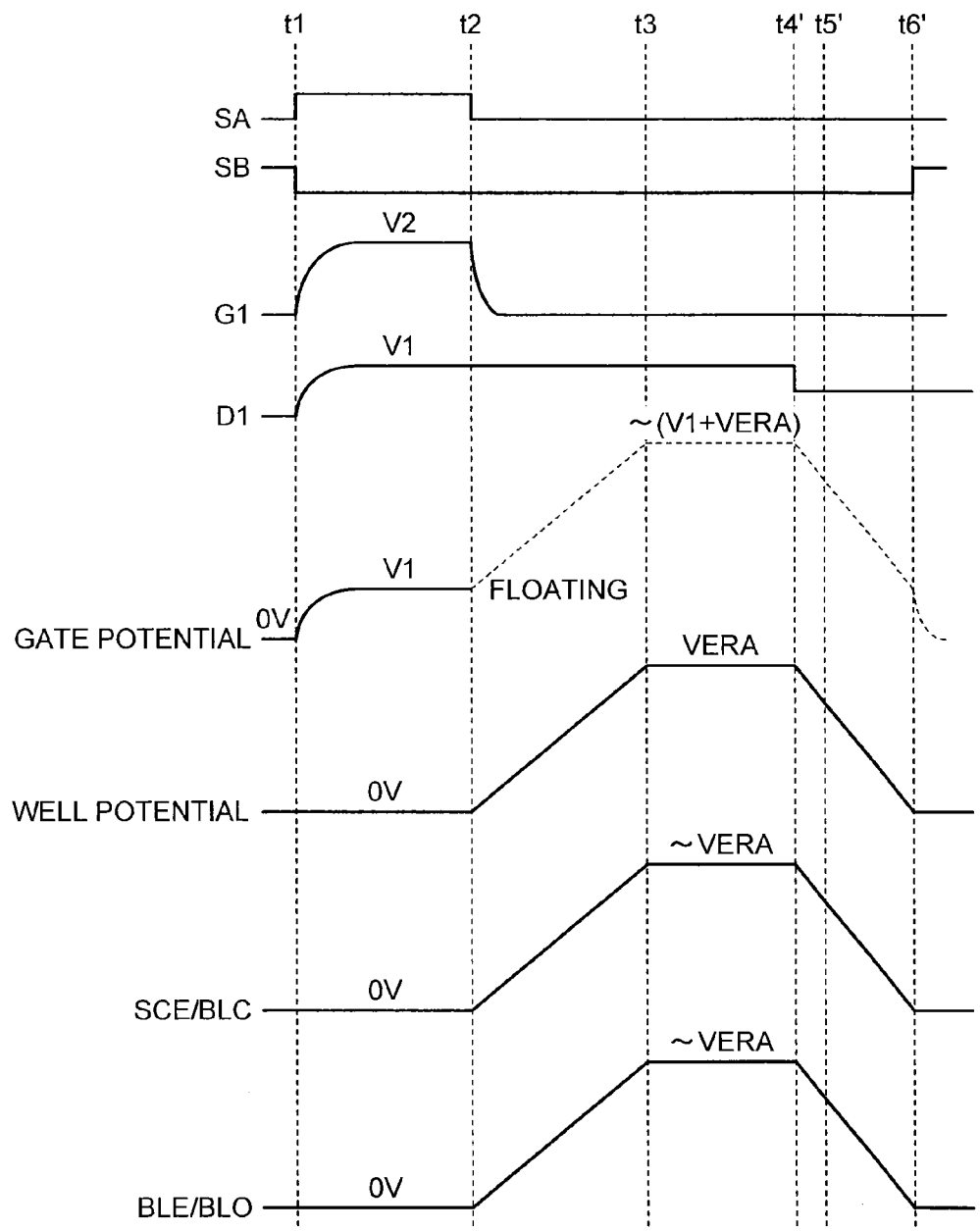
FIG. 12 is a timing chart illustrating voltage waveforms of components of the memory cell array illustrated in FIG. 3 and the gate driving circuit 7A illustrated in FIG. 8 when power disconnection occurs during an erasing period of the memory cell illustrated in FIG. 3.

FIG. 12 is a timing chart illustrating voltage waveforms of components of the memory cell array illustrated in FIG. 3 and the gate driving circuit 7A illustrated in FIG. 8 when power disconnection occurs during an erasing period of the memory cell illustrated in FIG. 3.

In FIG. 12, it is assumed that power disconnection occurs when the erase voltage VERA is applied to the cell well 11A (t4'). In this case, since the power of the inverter 44 is disconnected, the potential voltage V1 becomes 0 V, and a falling edge occurs in the source voltage D1 of the enhancement type transistor 43.

At this time, the gate electrodes of the enhancement type transistor 43 and the depletion type transistor 42 become the potential voltage V2 (0 V). In this case, since the enhancement type transistor 43 is turned off, even in the case where the depletion type transistor 42 is turned on during the power disconnection period, the discharge path from the gate electrode 26 is disconnected at the enhancement type transistor 43. Therefore, even in the case where a falling edge occurs in the source voltage D1 during the power disconnection period, it is possible to prevent the electric charges from be rapidly discharged from the gate electrode 26 through the depletion type transistor 42. As a result, according to the discharging of the cell well 11A, the potential of the gate electrode 26 is also decreased due to the coupling effect. In other words, it is possible to allow the gate potential of the gate electrode 26 to be fallen while allowing the gate potential to follow the falling edge in the well voltage potential of the cell well 11A (t4' to t6'), and it is possible to prevent a high voltage from being applied to the gate insulating film 31 of the charge/discharge transistor BCE.

In addition, since the depletion type transistor 42 is connected between the enhancement type transistor 43 and the gate electrode 26, even in the case where the drain side of the depletion type transistor 42 becomes a high voltage potential through the gate electrode 26, the depletion type transistor 42 serves as a resistance element. Since deterioration in the enhancement type transistor 43 can be reduced, it is possible to improve reliability of the gate driving circuit 7A. Particularly, the embodiment of the present invention is effective to the case where deterioration of the transistor is large due to off-leakage of the enhancement type transistor 43.

Second Embodiment

Figure 13:
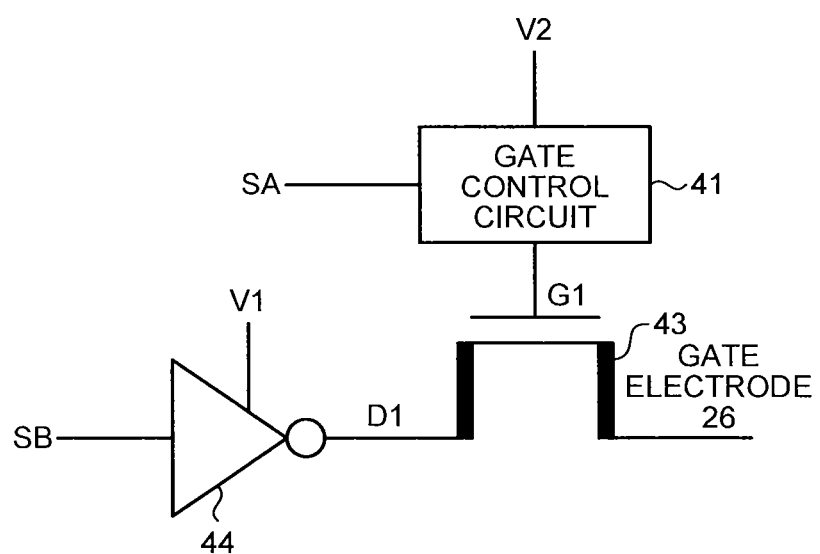
FIG. 13 is a block diagram illustrating a schematic configuration of a gate driving circuit applied to a nonvolatile semiconductor storage device according to a second embodiment.

FIG. 13 is a block diagram illustrating a schematic configuration of a gate driving circuit applied to a nonvolatile semiconductor storage device according to a second embodiment.

In the example illustrated in FIG. 12, the configuration where the depletion type transistor 42 is connected between the enhancement type transistor 43 and the gate electrode 26 is described. However, as illustrated in FIG. 13, the depletion type transistor 42 may not be provided, and the source of the enhancement type transistor 43 may be connected to the gate electrode 26. Therefore, the potential voltage V1 can be connected to the gate electrode 26 through only the enhancement type transistor 43 without use of the depletion type transistor 42. As a result, the potential voltage V1 can be set to be low, so that it is possible to reduce power consumption of the semiconductor storage device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device comprising:
   a memory cell array where memory cells are arranged in a cell well in a row direction and a column direction in a matrix;
   word lines which select the memory cell in the row direction;
   bit lines which select the memory cell in the column direction;
   a peripheral transistor which is arranged in the cell well;
   a depletion type transistor which drives a gate of the peripheral transistor;
   an enhancement type transistor which is connected in series to the depletion type transistor; and
   a gate control circuit which controls gate potential voltages of the depletion type transistor and the enhancement type transistor,
   wherein the gate control circuit controls the gate potential voltages of the depletion type transistor and the enhancement type transistor so that the enhancement type transistor is turned off during an erasing period of the memory cell.

2. The nonvolatile semiconductor storage device according to claim 1, wherein a plurality of memory cells are connected in series to constitute a NAND string, and select transistors are connected to two ends of the NAND string to constitute a NAND cell unit.

3. The nonvolatile semiconductor storage device according to claim 1, wherein the peripheral transistor is a charge/discharge transistor which charges or discharges the bit lines in cooperation with a charge operation or a discharge operation for the bit lines by a sense amplifier circuit.

4. The nonvolatile semiconductor storage device according to claim 1, further comprising a sense amplifier which determines a value stored in the memory cell based on a potential of the bit line,
   wherein the sense amplifier is shared by adjacent bit lines, and
   wherein the peripheral transistor includes:
   a select transistor which connects selected bit lines sharing the sense amplifier to the sense amplifier circuit; and
   a switching transistor which connects non-selected bit lines sharing the sense amplifier to a predetermined potential.

5. The nonvolatile semiconductor storage device according to claim 1, comprising an inverter which performs initial charging of a gate electrode of the peripheral transistor through the depletion type transistor and the enhancement type transistor during the erasing period of the memory cell, so that a channel is formed in the cell well under the gate electrode of the peripheral transistor.

6. The nonvolatile semiconductor storage device according to claim 5, wherein the gate control circuit allows the depletion type transistor and the enhancement type transistor to be turned off after the initial charging and sets the gate electrode of the peripheral transistor to a floating state.

7. The nonvolatile semiconductor storage device according to claim 6, wherein an erase voltage is applied to the cell well during the erasing period of the memory cell and the gate potential of the peripheral transistor follows a well potential of the cell well.

8. A nonvolatile semiconductor storage device comprising:
   a memory cell array where memory cells are arranged in a cell well in a row direction and a column direction in a matrix;
   word lines which select the memory cell in the row direction;
   bit lines which select the memory cell in the column direction;
   a peripheral transistor which is arranged in the cell well;
   a depletion type transistor which drives a gate of the peripheral transistor; and
   an enhancement type transistor which is connected in series to the depletion type transistor.

9. The nonvolatile semiconductor storage device according to claim 8, wherein a plurality of memory cells are connected in series to constitute a NAND string, and select transistors are connected to two ends of the NAND string to constitute a NAND cell unit.

10. The nonvolatile semiconductor storage device according to claim 8, wherein the peripheral transistor is a charge/discharge transistor which charges or discharges the bit lines in cooperation with a charge operation or a discharge operation for the bit lines by a sense amplifier circuit.

11. The nonvolatile semiconductor storage device according to claim 8, further comprising a sense amplifier which determines a value stored in the memory cell based on a potential of the bit line,
    wherein the sense amplifier is shared by adjacent bit lines, and
    wherein the peripheral transistor includes:
    a select transistor which connects selected bit lines sharing the sense amplifier to the sense amplifier circuit; and
    a switching transistor which connects non-selected bit lines sharing the sense amplifier to a predetermined potential.

12. The nonvolatile semiconductor storage device according to claim 8, wherein initial charging of a gate electrode of the peripheral transistor is performed through the depletion type transistor and the enhancement type transistor during an erasing period of the memory cell, so that a channel is formed in the cell well under the gate electrode of the peripheral transistor.

13. The nonvolatile semiconductor storage device according to claim 12, wherein the depletion type transistor and the enhancement type transistor are allowed to be turned off after the initial charging, and the gate electrode of the peripheral transistor is set to a floating state.

14. The nonvolatile semiconductor storage device according to claim 13, wherein an erase voltage is applied to the cell well during the erasing period of the memory cell and the gate potential of the peripheral transistor follows a well potential of the cell well.

15. A nonvolatile semiconductor storage device comprising:
- a memory cell array where memory cells are arranged in a cell well in a row direction and a column direction in a matrix;
- word lines which select the memory cell in the row direction;
- bit lines which select the memory cell in the column direction;
- a peripheral transistor which is formed in the cell well to be arranged in the periphery of the memory cell array; and
- an enhancement type transistor which drives a gate of the peripheral transistor.

16. The nonvolatile semiconductor storage device according to claim 15, wherein the peripheral transistor is a charge/discharge transistor which charges or discharges the bit lines in cooperation with a charge operation or a discharge operation for the bit lines by the sense amplifier circuit.

17. The nonvolatile semiconductor storage device according to claim 15, further comprising a sense amplifier which determines a value stored in the memory cell based on a potential of the bit line,
wherein the sense amplifier is shared by adjacent bit lines, and
wherein the peripheral transistor includes:
- a select transistor which connects selected bit lines sharing the sense amplifier to the sense amplifier circuit; and
- a switching transistor which connects non-selected bit lines sharing the sense amplifier to a predetermined potential.

18. The nonvolatile semiconductor storage device according to claim 15, wherein initial charging of a gate electrode of the peripheral transistor is performed through the enhancement type transistor during an erasing period of the memory cell, so that a channel is formed in the cell well under the gate electrode of the peripheral transistor.

19. The nonvolatile semiconductor storage device according to claim 18, wherein the enhancement type transistor are allowed to be turned off after the initial charging, and the gate electrode of the peripheral transistor is set to a floating state.

20. The nonvolatile semiconductor storage device according to claim 19, wherein an erase voltage is applied to the cell well during the erasing period of the memory cell and the gate potential of the peripheral transistor follows a well potential of the cell well.

* * * * *